United States Patent
Chiou et al.

(10) Patent No.: US 8,404,135 B2
(45) Date of Patent: Mar. 26, 2013

(54) PLASMA CLEANING FOR PROCESS CHAMBER COMPONENT REFURBISHMENT

(75) Inventors: Jian-Bin Chiou, Sanchong (TW);
Wen-Cheng Cheng, Hsinchu (TW);
Wen-Sheng Wu, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 956 days.

(21) Appl. No.: 12/198,193

(22) Filed: Aug. 26, 2008

(65) Prior Publication Data
US 2010/0051581 A1 Mar. 4, 2010

(51) Int. Cl.
*B44C 1/22* (2006.01)
*C23F 1/00* (2006.01)
*C23G 5/00* (2006.01)

(52) U.S. Cl. .................. 216/58; 216/67; 216/75; 134/2; 438/905; 427/248.1

(58) Field of Classification Search ........................ None
See application file for complete search history.

(56) References Cited

U.S. PATENT DOCUMENTS

| | | | |
|---|---|---|---|
| 6,274,058 B1 * | 8/2001 | Rajagopalan et al. | 216/67 |
| 6,656,535 B2 | 12/2003 | He et al. | |
| 6,902,628 B2 | 6/2005 | Wang et al. | |
| 6,902,629 B2 * | 6/2005 | Zheng et al. | 134/31 |
| 7,045,020 B2 | 5/2006 | Bhatnagar et al. | |
| 7,189,655 B2 * | 3/2007 | Takaoka | 438/706 |
| 7,588,036 B2 * | 9/2009 | Cui et al. | 134/1.1 |
| 7,674,722 B2 | 3/2010 | Nishita et al. | |
| 2004/0043626 A1 * | 3/2004 | Chou San et al. | 438/758 |
| 2005/0133059 A1 * | 6/2005 | Chen et al. | 134/1.1 |
| 2005/0145170 A1 | 7/2005 | Matsubara et al. | |
| 2006/0254613 A1 * | 11/2006 | Wu et al. | 134/1.1 |
| 2007/0113867 A1 * | 5/2007 | Duan et al. | 134/1.1 |
| 2007/0290247 A1 | 12/2007 | Nishita et al. | |
| 2008/0283086 A1 | 11/2008 | Matsubara et al. | |
| 2010/0130023 A1 | 5/2010 | Nishita et al. | |
| 2010/0288302 A1 * | 11/2010 | Ehm et al. | 134/1.1 |

FOREIGN PATENT DOCUMENTS

| | | |
|---|---|---|
| CN | 1363722 A | 8/2002 |
| CN | 1638026 A | 7/2005 |
| CN | 101044626 A | 9/2007 |

OTHER PUBLICATIONS

Official Action issued Aug. 12, 2010 in counterpart Chinese application.
Official Action issued Dec. 31, 2011, in counterpart Chinese application.

* cited by examiner

*Primary Examiner* — Anita Alanko
(74) *Attorney, Agent, or Firm* — Duane Morris LLP

(57) ABSTRACT

A method for cleaning and refurbishing a chamber component includes placing a chamber component having process deposits on an exterior surface in a plasma vapor deposition chamber. The chamber component is bombarded with a plasma comprising Argon for a period of time sufficient to remove the process deposits from the exterior surface of the chamber component.

12 Claims, 3 Drawing Sheets

PLASMA CLEANING FOR PROCESS CHAMBER COMPONENT REFURBISHMENT

FIELD OF DISCLOSURE

The disclosed system and method relate to cleaning a chamber component, and more specifically, the disclosed system and method relate to plasma cleaning a chamber component.

BACKGROUND

A substrate processing chamber may be used to process a substrate in an energized process gas, such as a plasma, to manufacture electronic circuits, such as integrated circuit chips and displays. A conventional process chamber includes an enclosure wall that encloses a process zone in which a process gas is introduced. The process chamber may be used to deposit material on a substrate or to etch material from a substrate.

Exposed chamber components are often coated with a coating layer that may enhance the adhesion of sputtered material onto the coating to increase the erosion resistance to plasma of the underlying material. For example, a chamber component may be made from aluminum oxide or quartz and plasma coated with a coating of aluminum. These coated components often require frequent cleaning and refurbishing to retain their designed characteristics. For example, when chamber components are used in plasma vapor deposition (PVD) processes to sputter deposit material onto a substrate from a target, the sputtered material also accumulates on the surfaces of the component. The accumulated process deposits can cause thermal expansion stresses that result in delamination, cracking, and flaking of the underlying coating from the underlying structure. Then, the plasma in the chamber can penetrate through damaged areas of the coating to erode the exposed surfaces of the underlying structure, eventually leading to failure of the component.

Conventional refurbishment processes implement a "lift-off" process to remove the coating from a coated component and to clean the surface of the component. The "lift-off" process includes immersing a coated component in an alkaline solution, such as KOH, to strip or dissolve the coating and remove the underlying process deposits. This "lift-off" process yields an uncoated component. Next, the surface of the un-coated component is cleaned by immersing the surface in an acidic solution, such as a solution of HF and $HNO_3$, to remove any remaining deposits. However, the acidic solution chemically attacks and causes damage to the surface of the component. Additionally, a subsequent coating that is applied to the damaged surface will not adhere well to the surface and may peel or flake off.

Another conventional method, such as that described in U.S. Pat. No. 6,902,628 issued to Wang et al., immerses a component having a metal coating in an acidic solution to remove a portion of the deposits from the surface of the component. The component is then immersed in an alkaline solution to remove substantially all of the metal coating. Once substantially all of the metal coating has been removed, the component may be bead blasted to roughen the surface of the component prior to reforming the metal coating. Similarly to the other conventional methods, the methods disclosed by Wang et al. result in damage to the surface of the component.

Accordingly, an improved method for cleaning a coated process chamber component is desired.

SUMMARY

In some embodiments, a method for cleaning and refurbishing a chamber component includes placing a chamber component having process deposits on an exterior surface in a plasma vapor deposition chamber. The chamber component is bombarded with a plasma comprising Argon for a period of time sufficient to remove the process deposits from the exterior surface of the chamber component.

DETAILED DESCRIPTION

Figure 1C:
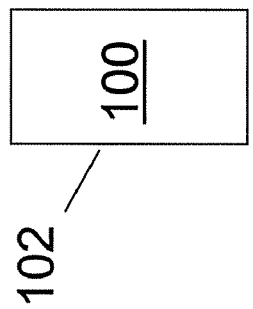
FIG. 1C illustrates one example of a chamber component after having been cleaned using a PVD process.
Figure 1B:
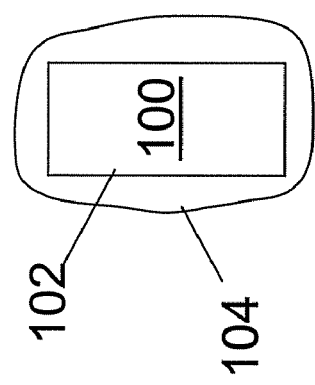
FIG. 1B illustrates one example of a chamber component having process deposits on an exterior surface.
Figure 1A:
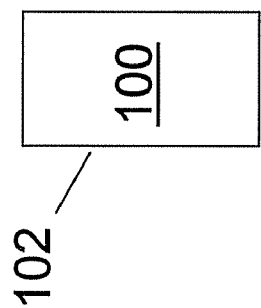
FIG. 1A illustrates one example of a clean chamber component

FIG. 1A illustrates a chamber component 100 that has an exterior surface 102, which may be cleaned in the manner described below. An example of a component 100 that may be cleaned by this method includes, but is not limited to, a tantalum coil. Chamber component 100 may be fabricated from a variety of materials. For example, the chamber component 100 may be a ceramic component comprising at least one of aluminum oxide, aluminum nitride, silicon carbide, and silicon nitride or the like. Alternatively, chamber component 100 may be a metallic component comprising at least one of aluminum, titanium, stainless steel, copper, and tantalum, or the like. In one embodiment, chamber 100 comprises tantalum and is coated with a thin film of tantalum nitride (TaN) having a thickness of approximately 0.1 mm to approximately 0.2 mm to prevent oxidation of the component.

After a certain amount of use, e.g., after a certain number of wafers have been processed, chamber component 100 may develop a layer of process deposits 104 on the exterior surface 102 as illustrated in FIG. 1B. The process deposits may be sputtered material that accumulates during a chemical vapor deposition (CVD) or plasma vapor deposition (PVD) processes.

Figure 2:
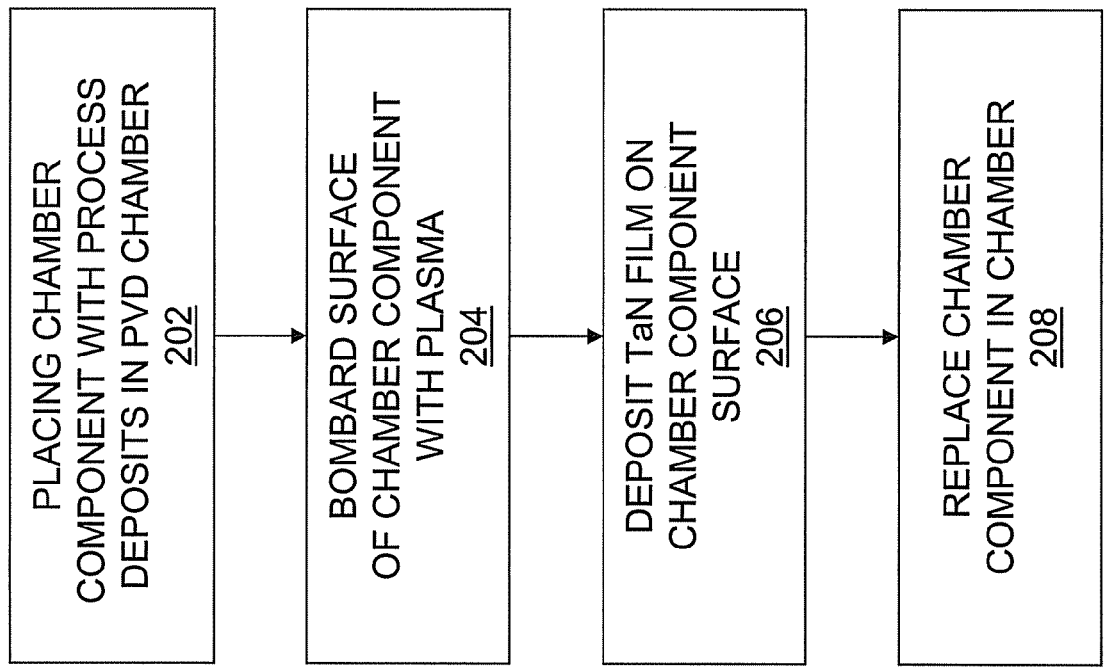
FIG. 2 illustrates a flow diagram of one example of a method for cleaning a chamber components using plasma vapor deposition.
Figure 3:
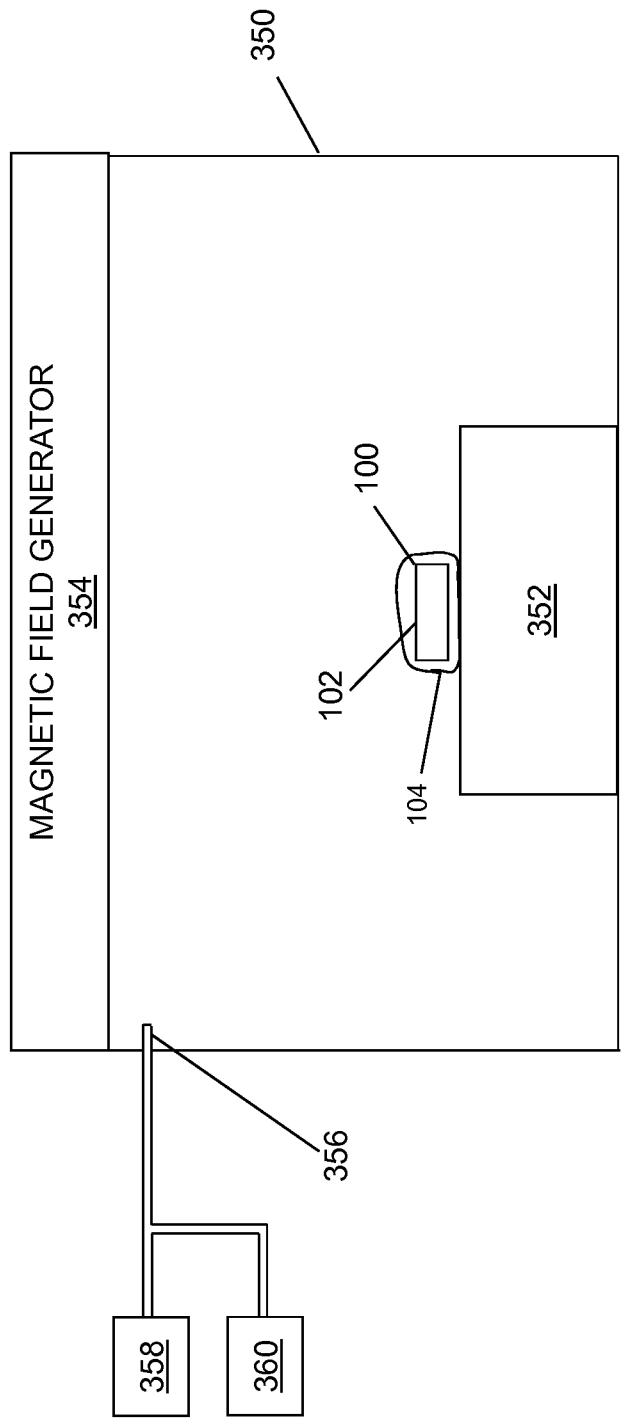
FIG. 3 illustrates one example of a chamber component having processing deposits disposed on an outer surface of the component, which is disposed in a processing chamber.

FIG. 2 is a block diagram of a method for cleaning a process chamber component. As shown in FIG. 2, a chamber component comprising tantalum (Ta) having process deposits formed on an exterior surface is placed in a chamber used for plasma vapor deposition at block 202. FIG. 3 illustrates a chamber component 100 having processing deposits 104 disposed on an outer surface 102 of the component 100 located in a processing chamber 350. Processing chamber 350 includes a pedestal 352, a magnetic field generator 354 and a gas inlet 356. Gas inlet 356 is shown connected to gas sources 358 and 356. Note that processing chamber 350 may include additional components not described, such as, for example, a DC power source, an RF power source, and an exhaust system.

Once located in the process chamber 350, the chamber component 100 is subjected to plasma bombardment until the exterior surface of the chamber component is free from process deposits at block 204. The plasma bombardment may be either a direct plasma bombardment or a downstream plasma bombardment. In one embodiment, the plasma is an Argon (Ar) plasma with a concentration of substantially 100 percent Ar. However, lower concentrations of Ar may be used. The duration of the plasma bombardment may vary depending on the amount of process deposits on the exterior of the chamber components. In some embodiments, the duration of the plasma bombardment is determined by multiplying a constant value by the thickness of the deposits to be removed. In some embodiments, the plasma bombardment may last for a period of up to four hours to remove the process deposits from the surface of the chamber component. However, one skilled in the art will appreciate that excessive plasma bombardment may damage the surface of the chamber component. The use of a downstream plasma for cleaning the component can further reduce the surface damage to the component.

In one embodiment, the Ar bombardment is performed at room temperature, e.g., approximately 25 degrees Celsius, at a flow rate of approximately 24 standard cubic centimeters per minute (sccm), in a chamber having a chamber pressure of approximately $2.6 \times 10^{-3}$ Torr, and with an RF power of approximately 2500 Watts. However, the Ar bombardment may be performed at other temperatures and pressures while utilizing various flow rates and RF powers.

Once the exterior surface of the chamber component 100 is free from process deposits, the chamber component 100 may be coated with a thin film to prevent oxidation of the component. For example, if the chamber component 100 is formed from tantalum, then a thin film of tantalum nitride (TaN) may be deposited on the surface of the component by flowing an $N_2$ gas over the surface of the component. This may be accomplished by closing or reducing the opening of a valve connected to gas source 358, which may be an Argon gas source, and opening a valve connected to a second gas source 360, which may be a nitrogen gas source. Alternatively, the valves connected to the first and second gas sources 358, 360 may be opened and both gasses flowed into the chamber. One skilled in the art will appreciate that other thin films may be deposited on chamber components formed from other materials.

In one embodiment, the $N_2$ is flowed into processing chamber 350 having a chamber pressure of approximately $3.0 \times 10^{-3}$ Torr at a flow rate of approximately 4 while Ar is flowed into the processing chamber 350 at a flow rate of approximately 30 sccm. The nitrogen is flowed over the component for approximately ten to twenty minutes to deposit the desired amount of TaN on the surface of the chamber component. However, the deposition time may vary depending on the chamber settings and the amount of TaN film that is desired to be formed. In some embodiments, the duration is proportional to the thickness of the TaN film to be formed.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A method of refurbishing a process chamber component, comprising the steps of:
    placing a chamber component comprising tantalum and having process deposits disposed on an exterior surface in a plasma vapor deposition (PVD) chamber;
    bombarding the chamber component with a plasma for a period of time sufficient to remove the process deposits wherein the plasma consists essentially of inert gas ions; and
    depositing a film comprising TaN on the surface of the chamber component by flowing an $N_2$ gas into the PVD chamber after bombarding the chamber component.

2. The method of claim 1, wherein the plasma comprises substantially 100 percent Argon.

3. The method of claim 1, wherein the period of time sufficient to remove the process deposits is approximately four hours.

4. The method of claim 1, wherein the period of time sufficient to remove the process deposits is proportional to a thickness of the process deposits.

5. The method of claim 1, wherein the $N_2$ gas is flowed into the chamber for approximately 10 to 20 minutes.

6. The method of claim 2, wherein the Argon is flowed into the chamber at a flow rate of approximately 24 sccm.

7. The method of claim 6, wherein the Argon plasma bombardment is performed at a temperature of approximately 25 degrees Celsius in a chamber having a chamber pressure of approximately $2.6 \times 10^{-3}$ Torr.

8. The method of claim 7, wherein the plasma bombardment is performed with an RF power of approximately 2500 Watts.

9. The method of claim 1, wherein the $N_2$ is flowed into the chamber at a flow rate of approximately 4 sccm.

10. The method of claim 9, wherein film of TaN is deposited on the chamber component in a chamber having a chamber pressure of approximately $3.0 \times 10^{-3}$ Torr.

11. The method of claim 1, wherein the chamber component is bombarded with a downstream plasma.

12. A method of refurbishing a process chamber component, comprising the steps of:
    placing a chamber component comprising tantalum and having process deposits disposed on an exterior surface in a plasma vapor deposition (PVD) chamber;
    bombarding the chamber component with a plasma of substantially 100 percent Argon for a period of time sufficient to remove the process deposits; and
    depositing a film comprising TaN on the surface of the chamber component by flowing an $N_2$ gas into the PVD chamber after bombarding the chamber component.

* * * * *